United States Patent
Ohmi et al.

(10) Patent No.: US 6,954,359 B2
(45) Date of Patent: *Oct. 11, 2005

(54) COOLING DEVICE, ELECTRONIC APPARATUS, DISPLAY UNIT, AND METHOD OF PRODUCING COOLING DEVICE

(75) Inventors: Motosuke Ohmi, Tokyo (JP); Eisaku Kato, Tokyo (JP); Minehiro Tonosaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 24 days.

This patent is subject to a terminal disclaimer.

(21) Appl. No.: 10/895,070

(22) Filed: Jul. 21, 2004

(65) Prior Publication Data

US 2004/0257768 A1 Dec. 23, 2004

Related U.S. Application Data

(62) Division of application No. 10/608,153, filed on Jun. 30, 2003, now Pat. No. 6,785,135.

(30) Foreign Application Priority Data

Jul. 5, 2002 (JP) ........................................ 2002-198021

(51) Int. Cl.[7] ................................................ H05K 7/20
(52) U.S. Cl. ........................ 361/700; 361/699; 257/714; 257/715; 174/15.2; 165/104.26
(58) Field of Search ................................. 361/699, 700; 257/715; 174/15.2; 165/80.4, 104.26

(56) References Cited

U.S. PATENT DOCUMENTS

| | | | |
|---|---|---|---|
| 5,343,940 A | | 9/1994 | Jean |
| 5,611,214 A | | 3/1997 | Wegeng et al. |
| 5,642,776 A | | 7/1997 | Meyer et al. |
| 5,647,429 A | * | 7/1997 | Oktay et al. ........... 165/104.26 |
| 6,105,662 A | * | 8/2000 | Suzuki .................. 165/104.33 |
| 6,269,865 B1 | * | 8/2001 | Huang .................... 165/104.26 |
| 6,411,512 B1 | | 6/2002 | Mankaruse et al. |
| 6,418,019 B1 | | 7/2002 | Snyder et al. |
| 6,437,981 B1 | | 8/2002 | Newton et al. |
| 6,437,983 B1 | * | 8/2002 | Machiroutu et al. ........ 361/700 |
| 6,446,706 B1 | * | 9/2002 | Rosenfeld et al. ............ 165/46 |
| 6,490,159 B1 | | 12/2002 | Goenka et al. |
| 6,501,654 B2 | | 12/2002 | O'Connor et al. |
| 6,533,029 B1 | * | 3/2003 | Phillips ................. 165/104.26 |
| 6,843,308 B1 | * | 1/2005 | Duval .................... 165/104.26 |

* cited by examiner

Primary Examiner—Boris Chervinsky
(74) Attorney, Agent, or Firm—Oblon, Spivak, McClelland, Maier & Neustadt, P.C.

(57) ABSTRACT

A cooling device includes a flow-path substrate, an intermediate substrate, and a lid-substrate each made of a polyimide resin, and a condenser substrate incorporated into holes of the intermediate substrate and an evaporator substrate which are made of a metal having a high thermal conductivity, whereby heat from a heat source can be enclosed into the evaporator substrate and the condenser substrate, so that the quantity of the latent heat can be substantially increased.

1 Claim, 12 Drawing Sheets

COOLING DEVICE, ELECTRONIC APPARATUS, DISPLAY UNIT, AND METHOD OF PRODUCING COOLING DEVICE

CROSS REFERENCE TO RELATED APPLICATIONS

This application is a divisional application of U.S. Ser. No. 10/608,153, filed Jun. 30, 2003 now U.S. Pat. No. 6,785,135.

BACKGROUND OF THE INVENTION

1. Field of the Invention

The present invention relates to a cooling device which is used to reduce the temperature caused by heat generated, e.g., from a driver of a card type memory medium used in a personal computer, a digital camera, or the like, and to a method of producing the same. Moreover, the present invention relates to an electronic apparatus such as a personal computer, a digital camera, or the like, on which the cooling device is mounted.

2. Description of the Related Art

Storage media such as Memory Stick (registered trademark), Smart Media (registered trademark), Compact Flash (registered trademark), and so forth are small in size and thickness, and also the storage capacities can be considerably increased compared to conventional storage media such as Floppy (registered trademark) disks or the like. Thus, they have been generally used in electronic apparatuses such as personal computers, digital cameras, and so forth. Regarding some of these storage media, flash memories integrated with drivers are used, or drivers are mounted on the main parts of apparatuses, other cards, or the like. For the storage media, recently, the capacities have been significantly increased. With increasing of the storage capacities of the storage media as described above, problems have arisen in that much heat is generated to cause defects in operation.

Accordingly, it has been proposed that a cooling device is provided for a heat source in such an apparatus. For example, a cooling method using a heat pipe has been proposed.

A heat pipe is a metallic pipe of which the inner wall has a capillary structure, of which the inside is evacuated, and which tightly contains a small amount of water or a substitution Freon therein. When one end of the heat pipe is brought into contact with a heat source to be heated, the liquid contained therein is evaporated. Then, heat is taken into the gas as latent heat (evaporation heat). The heat is transferred to a low temperature region at a high speed (substantially equal to a sound velocity). The gas is cooled to be returned to the liquid, and the heat is released (the heat is released due to the condensation latent heat). The liquid is passed through the capillary structure (or due to the gravity) to be returned to its original position. Thus, the heat can be efficiently transferred.

However, the related art heat pipe is tubular and voluminous. Accordingly, the heat pipe is unsuitable as a cooling device for use in electronic apparatuses such as personal computers, digital cameras, and so forth for which reduction of the size and the thickness is required.

Accordingly, to reduce the size of the heat pipe, a cooling device has been proposed in which grooves are formed on the surface of a silicon substrate and that of a glass substrate to be joined to each other, and these substrates are joined to form the flow-path of a heat pipe between the substrates. When the joining is carried out, a small amount of water or a substitution Freon is introduced to be tightly kept. The phase of the water or Freon is changed in the heat pipe, so that the function of the heat pipe can be performed.

However, in the case in which the heat pipe is formed by use of a silicon substrate as described above, heat from an object to be cooled is diff-used, since the thermal conductivity of the silicon itself is high. Thus, there are problems in that the evaporation of a liquid in the heat pipe is insufficient, or the evaporation is not caused at all, so that the function of the heat pipe can not be carried out.

Moreover, electronic apparatuses having silicone substrates mounted thereon have problems in that they may be broken in event that the apparatuses drop.

SUMMARY OF THE INVENTION

Accordingly, it is an object of the present invention to provide a cooling device of which the cooling performance, the thermal stability, and strength are superior, an electronic apparatus and a display unit each containing the cooling device, and a method of producing the cooling device.

According to a first aspect of the present invention, there is provided a cooling device which comprises a first substrate having grooves constituting a heat pipe formed therein so as to be exposed to the surface thereof, the grooves excluding at least the groove positioned in correspondence to a wick, a second substrate made of a metal or a material having a thermal conductivity substantially equal to that of a metal, the second substrate having at least the groove for the wick formed at the surface thereof, said surface being joined to the first substrate, and a third substrate into which the second substrate is incorporated so as to be exposed to the surface of the third substrate, said surface of the third substrate being joined to the first substrate, at least one of the first substrate and the third substrate being made of a polyimide resin.

According to the present invention, the second substrate having a groove for a wick formed on one side thereof is made of a material having a thermal conductivity substantially equal to a metal. Thus, heat from a heat source can be efficiently transferred to the groove of the wick. On the other hand, the first substrate and so forth are made of a polyimide resin, so that the thermal conductivity is low. Thus, the heat accumulated in the wick is less diffused. Accordingly, the heat is enclosed in the wick, so that the quantity of the latent heat can be substantially increased. Thus, the cooling performance of the heat pipe can be enhanced. In addition, the polyimide resin, which is thermally stable and flexible, is superior in strength. Thereby, the service life of the cooling device can be increased.

Preferably, the fourth substrate of the cooling device having at least a groove for a condenser formed on the surface thereof is made of a metal or a material having a thermal conductivity substantially equal to a metal. Thus, heat from a heat source can be efficiently transferred to the groove of the condenser. On the other hand, the first substrate and so forth are made of a polyimide resin, so that the thermal conductivity is low. Thus, the heat accumulated in the wick is less diffused. Accordingly, the heat is enclosed in the condenser, so that the quantity of the latent heat can be substantially increased. Thus, the cooling performance of the heat pipe can be enhanced.

Preferably, at least one of the second substrate and the fourth substrate is made of a metal containing copper or nickel. Therefore, the heat efficiency is enhanced.

Moreover, a thin film layer made of silicon or copper may be interposed between the one side of the first substrate and the one side of the third substrate. Thereby, the first substrate and the third substrate each made of a polyimide resin can be joined to each other via the thin films of silicon or copper or via an adhesive provided between the thin films. In this case, as the adhesive, a thermoplastic resin such as a thermoplastic polyimide or the like is suitably used.

Preferably, the first substrate and the third substrate joined to each other are physically separated from each other into a region containing the second substrate and a region containing the condenser as a component of the heat pipe, and the cooling device further comprises a flexible substrate interposed between the separated regions and has a flow-path formed therein so as to connect the wick and the condenser to each other. This enables the flow-path substrate for forming a heat pipe to have a flexible shape.

According to a second aspect of the present invention, there is provided a cooling device which comprises a first member having at least a wick as a component of a heat pipe, a second member physically separated from the first member and provided with a condenser as a component of the heat pipe, and a flexible substrate interposed between the first member and the second member and having a flow-path for connecting the wick and the condenser to each other formed therein, at least one of the first member and the second member being made of a polyimide resin. Thus, the wick member and the condenser member can be installed, even if they are not arranged on a plane.

According to a third aspect of the present invention, there is provided a cooling device which comprises: a first substrate having open grooves constituting a heat pipe formed therein, the open groove excluding at least the open groove positioned in correspondence to a wick; a second substrate made of a material having a thermal conductivity substantially equal to that of a metal, the second substrate having at least the groove for the wick formed at the surface thereof, said surface being joined to the first substrate; a third substrate into which the second substrate is incorporated so as to exposed to the surface of the third substrate, said surface of the third substrate being joined to the first substrate; and a lid-substrate joined to the surface of the first substrate so as to cover said surface which is opposite to the side of the first substrate where the first substrate and the second substrate are joined to each other; at least one of the first substrate, the third substrate, and the lid-substrate being made of a polyimide resin.

Thus, the lid-substrate is brought in close contact with the open grooves of the first substrate, so that the flow-path of a heat pipe can be formed, and the thickness of the first substrate becomes that of the flow-path. Thus, the flow-path is substantially increased in size, so that the performance of the heat pipe is increased.

Preferably, the flow-path for a working fluid, formed by joining of the open grooves of the first substrate and the lid-substrate, has a diamond-like carbon film formed on the inner wall thereof.

In the cooling device of the present invention, at least one of the first substrate, the third substrate and the lid-substrate is made of a polyimide resin. The polyimide resin is water-absorptive to some degree. Accordingly, in the case in which the flow-path for a working fluid is made of a polyimide resin, the durability can be increased by formation of such a diamond-like carbon film on the surface of the flow-path.

According to a fourth aspect of the present invention, there is provided an electronic apparatus which comprises: a slot to or from which a card type storage device containing a flash memory and a driver can be attached or detached; and a cooling device arranged adjacently to the slot, the cooling device comprising a first substrate having grooves constituting a heat pipe formed therein so as to be exposed to the surface thereof, the groove excluding at least the groove positioned in correspondence to a wick, a second substrate made of a metal or a material having a thermal conductivity substantially equal to that of a metal, the second substrate having at least the groove for the wick formed at the surface thereof, said surface being joined to the first substrate, and a third substrate into which the second substrate is incorporated so as to be exposed to the surface of the third substrate, said surface of the third substrate being joined to the first substrate, the first substrate and the third substrate being made of a polyimide resin.

The present invention may be applied as cooling devices for central processing units of note-sizes personal computers, slots for attachment of external storage units, and drivers for liquid crystal display units and so forth. Thereby, the cooling performance of these apparatuses can be enhanced, and moreover, the apparatus can be given a high strength.

According to a fifth aspect of the present invention, there is provided a method of producing a cooling device which comprises the steps of a method of processing a cooling device comprising the steps of forming a first substrate made of a polyimide resin and having grooves constituting a heat pipe formed therein so as to be exposed to the surface thereof, the grooves excluding at least the groove positioned in correspondence to a wick; forming a second substrate made of a metal or a material having a thermal conductivity substantially equal to that of a metal, the second substrate having at least the groove for the wick formed on the surface thereof, incorporating the second substrate into a third substrate so as to be exposed to the surface of the third substrate, and joining the surface of the first substrate to the surface of the third substrate to each other. According to this invention, the cooling device having the above-described structure can be produced efficiently and securely.

Preferably, the method further comprises a step of incorporating the fourth substrate made of a metal or a material having a thermal conductivity substantially equal to that of a metal into the third substrate so as to be exposed to the surface of the third substrate. According to this structure, the condenser section is made of a material having a high thermal conductivity, and thereby, heat can be effectively transferred.

The surface of the first substrate and that of the third substrate may be melt-joined to each other by heating the first and second substrates. Accordingly, the joining can be securely carried out, and the cost reduction becomes possible, due to the simple joining process.

Preferably, the method further comprises a step of forming a diamond-like carbon film in the grooves of first substrate. Thus, the service life of the substrate made of a polyimide resin is enhanced. The cooling performance is enhanced, due to the increased fluidity of the working fluid.

According to a sixth aspect of the present invention, there is provided a method of producing a cooling device which comprises the steps of forming a first substrate having open grooves constituting a heat pipe formed therein, the open grooves excluding at least the open groove positioned in correspondence to a wick, forming a second substrate made of a metal or a material having a thermal conductivity substantially equal to that of a metal, the second substrate having at least the groove for the wick formed on the surface thereof, joining a first surface of the first substrate to a lid-substrate to form a flow-path for a working liquid, incorporating the second substrate into a third substrate so as to be exposed to the surface of the third substrate, and joining the surface of the third substrate to the second surface of the first substrate.

Thereby, the cooling device having the above-described structure can be produced efficiently and securely.

Preferably, the method further comprises the steps of: forming a fourth substrate made of a metal or a material having a thermal conductivity substantially equal to that of a metal, the fourth substrate having at least a groove for a condenser formed on the surface thereof, and incorporating the fourth substrate intio the third substrate so as to be exposed to the surface of the third surface. Thereby, the heat-radiating means (condenser) can be efficiently incorporated in the device.

Preferably, the step of forming the flow-path for a working fluid includes a step of forming a diamond-like film on the surface of the flow-path. Thereby, the cooling device of which the substrates have enhanced durability and cooling performance is produced.

DESCRIPTION OF THE PREFERRED EMBODIMENTS

Hereinafter, embodiments of the present invention will be described with reference to the drawings.

(Cooling Device)

Figure 1:
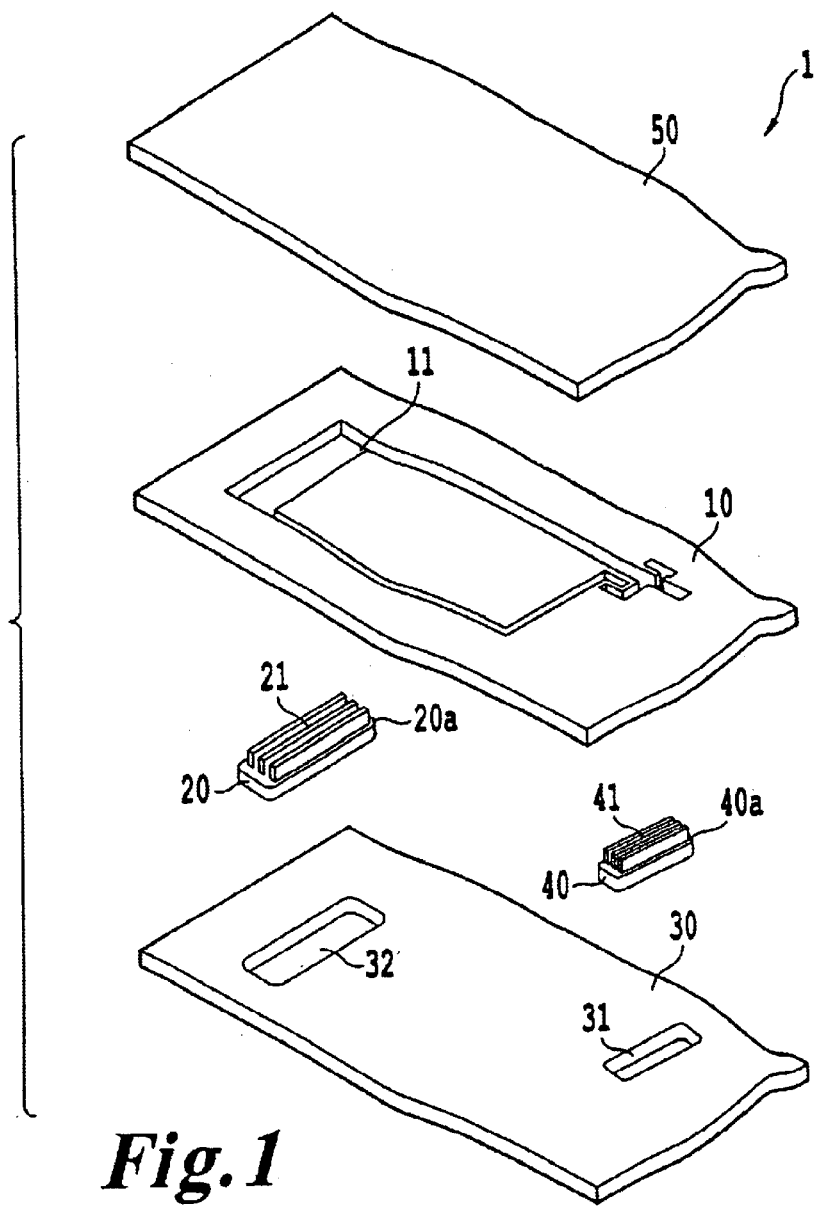
FIG. 1 is an exploded perspective view showing the structure of a cooling device according to the present invention.
Figure 2:
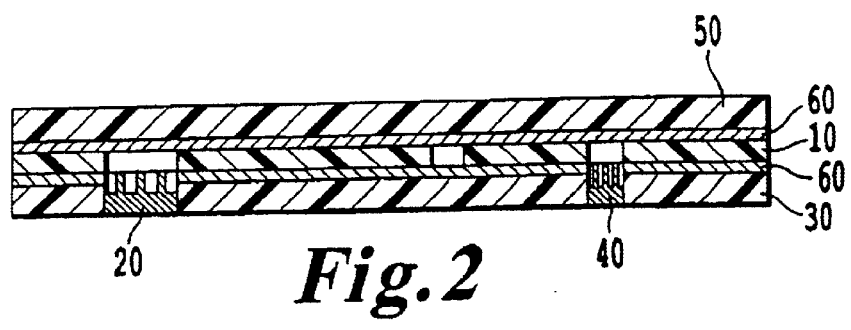
FIG. 2 is a cross-sectional view of the assembled cooling device according to the embodiment of the present invention.

FIG. 1 is a perspective view of a cooling device according to the present invention which is in the dissembled state. FIG. 2 is a cross-sectional view of the cooling device which is in the assembled state.

As shown in FIGS. 1 and 2, a cooling device 1 comprises five substrates 10, 20, 30, 40, and 50. The flow-path substrate 10, the intermediate substrate 30, and the lid-substrate 50 are rectangular and are made of a polyimide resin which is not thermoplastic. The condenser substrate 20 and the evaporator substrate 40 are rectangular substrates, e.g., made of a metal with a high thermal conductivity such as copper or the like. The condenser substrate 20 and the evaporator substrate 40 are incorporated into holes 31 and 32 of the intermediate substrate 30, respectively. Regarding these five substrates 10, 20, 30, 40, and 50, the joining surfaces thereof are covered with a copper thin film (not shown in the drawings), respectively. These substrates are secured to each other by hot-press joining via an adhesive layer 60 of a thermoplastic polyimide resin (e.g., Upilex VT, manufactured by Ube Industries Ltd., etc.). Grooves 21 are formed on the surface 20a of the condenser substrate 20, and grooves 41 are formed on the surface 40a of the evaporator substrate 40. An open groove 11 is formed in the flow-path substrate 10. Moreover, holes 31 and 32 are formed in the intermediate substrate 30. The grooves 21 and 41, the open groove 11, and the holes 31 and 32 are formed by bonding so as to function as a loop-shaped heat pipe.

Hereinafter, the constitution of the grooves 21 formed in the condenser substrate 20, the grooves 41 formed in the evaporator substrate 40, the open groove 11 in the flow-path substrate 10, and the holes 31 and 32 in the intermediate substrate 30, and the lid-substrate 50 will be described with reference to FIG. 3.

Figure 3:
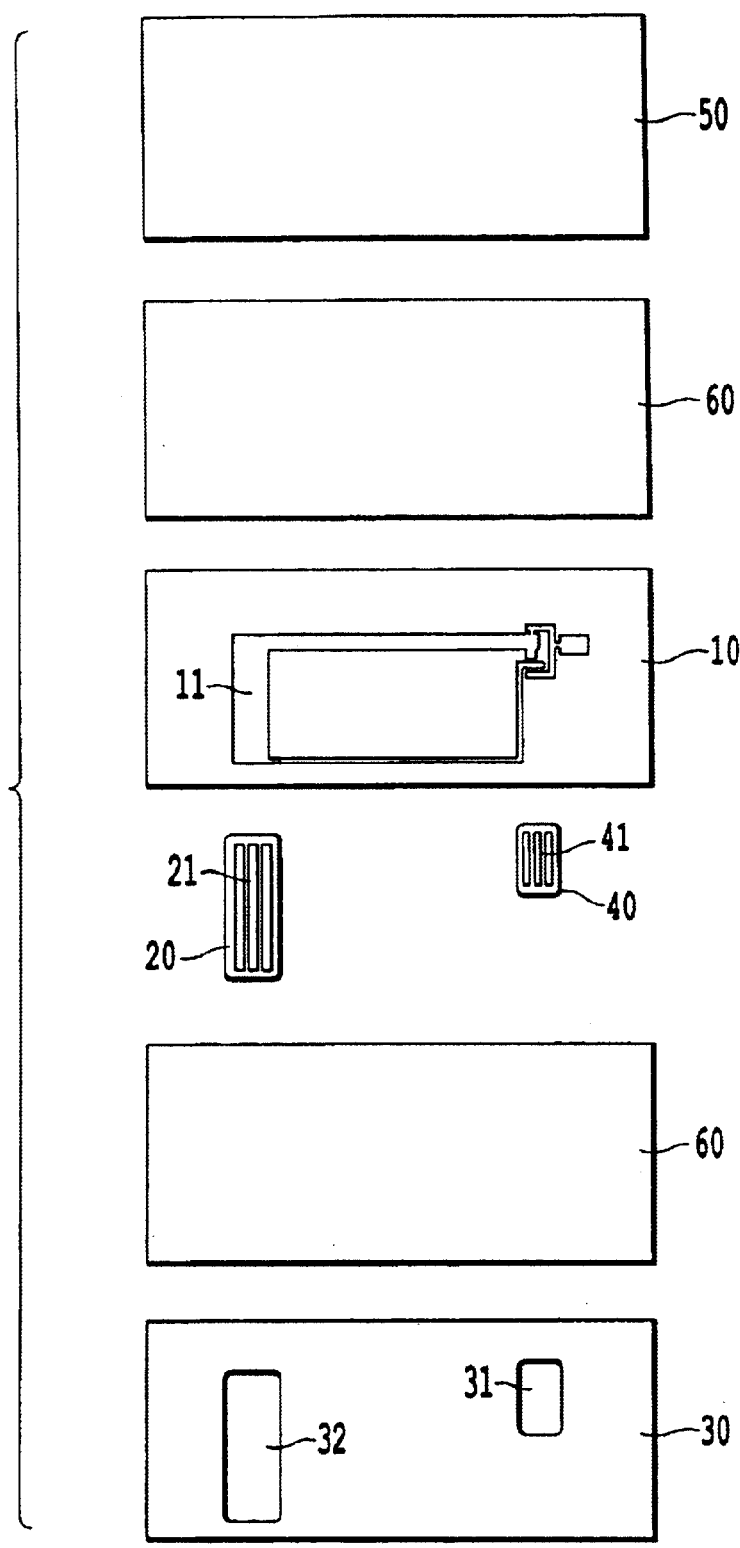
FIG. 3 consists of plan views of the respective substrates of the cooling device according to the embodiment of the present invention.

As shown in FIG. 3, a copper thin-film (not shown) is formed on the surface of the lid substrate 50 which is to be bonded to the flow-path substrate 10.

The open grooves 11 are formed in the flow-path substrate 10 so as to pass through the flow-path substrate 10, respectively. The open grooves 11, when they are bonded to the lid-substrate 50 via the adhesion layer 60, form a liquid phase path 12 through which the liquid flows as a working fluid, a gas phase path 15 through which the gas flows as the working fluid, and a reservoir 13 in which the liquid is stored and supplied. Thin-films (not shown) of diamond-like carbon (hereinafter, referred to as DLC) may be formed in the liquid phase path 12, the gas phase path 15, and the groove of the reservoir 13, which are formed by using the lid-substrate 50 and the flow-path substrate 10. The polyimide resin, which is a material for the lid-substrate 50 and the flow-path substrate 10, is water-absorptive to some degree. Thus, problematically, the substrate 50 and 10 may be distorted. The thin-film layers made of DLC function as protecting films, and thereby, the cooling device 1 has a superior durability.

The holes 31 and 32 are formed in the intermediate substrate 30 so as to pass through the intermediate substrate 30.

The grooves 21 are formed on the surface 20a of the condenser substrate 20. The grooves 21 function as a condenser which condenses the gas introduced therein through the gas phase path 15 into the liquid, and circulates the produced liquid to a low temperature portion 16.

The grooves 41 are formed on the surface 40a of the evaporator substrate 40. The grooves 41 function as a cooling portion. The grooves 41 function so that the liquid introduced through the liquid phase path 12 or the reservoir 13 into the groves 41 is evaporated, and the produced gas is flown into an evaporation portion 14.

Figure 4:
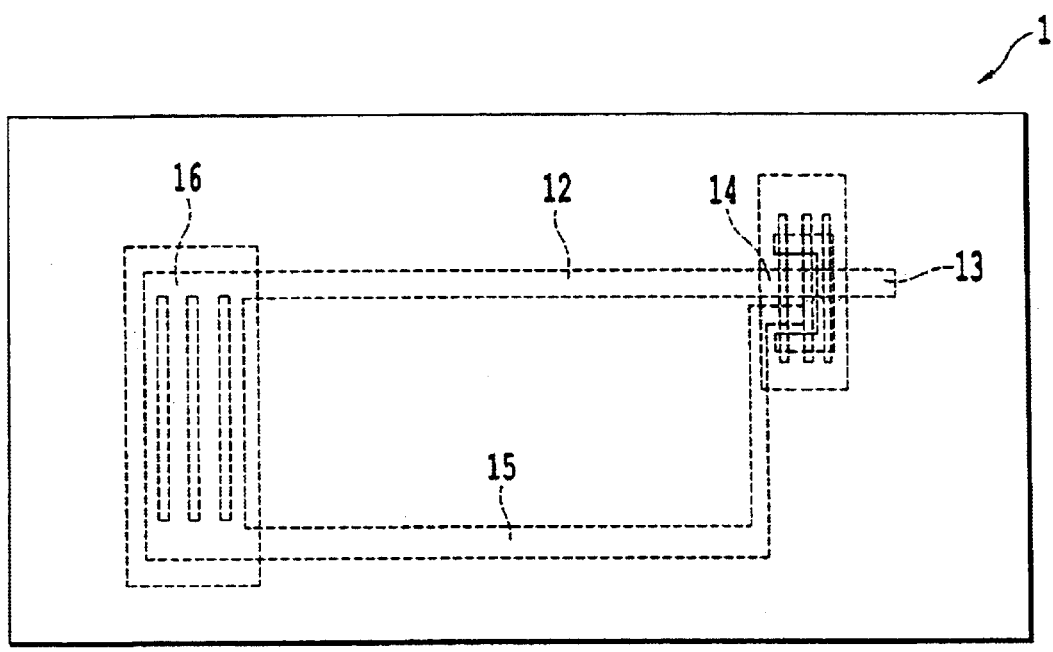
FIG. 4 is a plan view of the cooling device according to the embodiment of the present invention which is assembled by the flow-path substrate, the intermediate substrate, the condenser substrate, and the evaporator substrate.

FIG. 4 shows the substrates 10, 20, 30, 40, and 50 which are joined to each other.

A liquid is placed and kept tightly inside of the heat pipe which is formed by joining the substrate 10, 20, 30, 40, and 50. The liquid tightly enclosed in the heat pipe is circulated while it is changed from its gas phase to its liquid phase, and vice versa in the heat pipe, whereby heat transfer is carried out. Thus, the cooling device 1 functions.

Hereinafter, the circulation of the liquid and the gas is described, in which the circulation starts at the liquid phase path 12 for convenience' sake.

First, the liquid is flown into the evaporation portion 14 through the liquid phase path 12. In this case, if the quantity of the liquid flown into the evaporation portion 14 is smaller than a predetermined amount, a liquid in such an amount as compensates for the deficiency is supplied from the reservoir 13 so that the drying out is prevented.

The liquid flown into the evaporation portion 14 is heated to boil. The gas, which is produced by the boiling, is flown into the low temperature portion 16 via the gas phase path 15, and is condensed into the liquid. The liquid, produced by the condensation, is flown from the low temperature portion 16 into the liquid phase path 12 to be circulated.

According to this embodiment, the condenser substrate 20 and the evaporator substrate 40 are made of copper. However, as the materials for the substrates 20 and 40, silicon, nickel, or the like may be used.

Figure 5A:
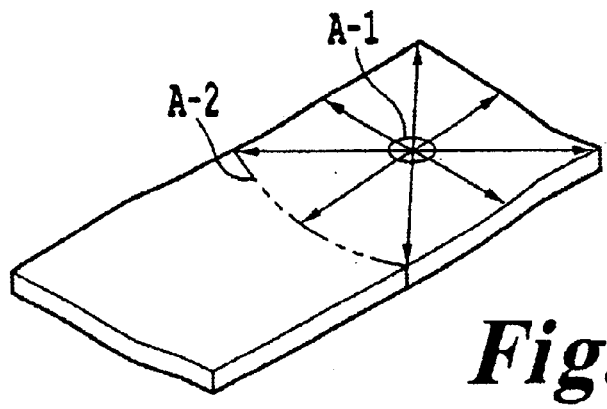
FIG. 5A is a perspective view of a silicon substrate.
Figure 5B:
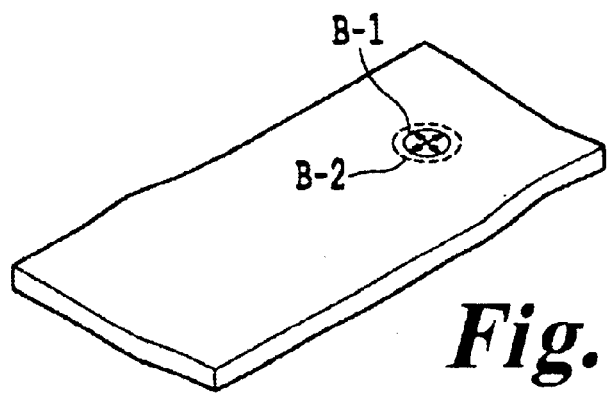
FIG. 5B is a perspective view of a resin substrate.
Figure 5C:
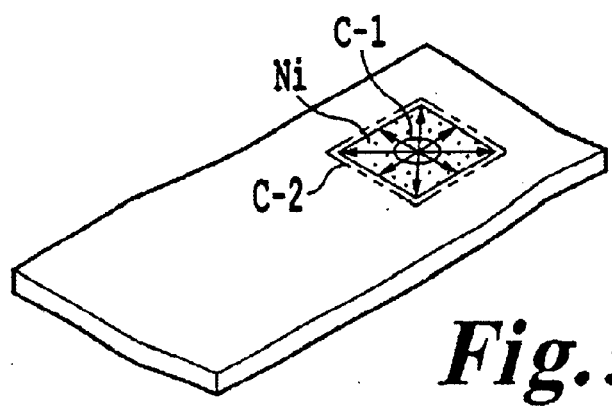
FIG. 5C is a perspective view of a polyimide resin-metal composite substrate according to the present invention which is compared to the silicon substrate of FIG. 5A and the polyimide resin substrate of FIG. 5B from the standpoint of the thermal diffusion properties.

FIGS. 5A, 5B, and 5C schematically show the areas where heat is diffused on substrates in a predetermined time, respectively. FIG. 5A shows the diffusion of heat on a silicon substrate. FIG. 5B shows that on a polyimide resin substrate. FIG. 5C shows that on a composite substrate comprising a polyimide resin and a metal, such as copper incorporated into a polyimide resin substrate.

As shown in FIG. 5A, heat from a heat source A-1 for the silicon substrate is diffused in a wide area as shown by arrows (A-2) in FIG. 5A. On the other hand, as shown in FIG. 5B, heat from a heat source B-1 for the polyimide substrate is not widely diffused in a wide area as shown by the arrows in FIG. 5B (the heat is diffused in a region B-2).

A predetermined quantity or more of heat is required to be concentrated to the evaporator so that the heat pipe can function. In the case in which the substrate is made of a silicon material as shown in FIG. 5A, the function of the heat pipe can not be sufficiently carried out, since heat is excessively diffused.

Furthermore, the evaporator is required to have a thermal conductivity of a predetermined value or higher, so that the heat pipe can function. As shown in FIG. 5B, the thermal conductivity of the substrate made of a polyimide resin only is substantially zero, the function of the heat pipe can not be sufficiently carried out.

On the other hand, according to the present invention, as shown in FIG. 5C, heat from the heat source C-1 in the polyimide resin—metal composite substrate is highly diffused in the metal portion, and is hardly diffused in the polyimide resin region in the periphery of the metal portion (C-2). Thus, the heat is sufficiently transferred in the evaporator, while the heat is difficult to be diffused in the surrounding polyimide resin portion. Therefore, the heat is concentrated to the evaporator. Thus, the function of the heat pipe can be satisfactorily carried out.

The cooling device 1 of the present invention comprises the flow-path substrate 10, the intermediate substrate 30, and the lid-substrate 50 which are made of a polyimide resin, respectively, and the condenser substrate 20 and the evaporator substrate 40 which are made of a metal having a high thermal conductivity, and are incorporated into the holes 31 and 32 of the intermediate substrate 30, respectively.

According to the above-described constitution, the evaporator substrate 40 having the grooves of the wick is made of a metal or a material having such a high thermal conductivity as that of the metal, so that heat from a heat source can be transferred to the grooves of the wick at high efficiency. On the other hand, the flow-path substrate 10, the intermediate substrate 30, the lid-substrate 59, and so forth, made of a polyimide resin, have a low thermal conductivity. Thus, the heat stored in the wick is less diff-used, i.e., the heat is enclosed. Thus, the quantity of the latent heat can be substantially increased, so that the cooling performance of the heat pipe can be enhanced. Moreover, the polyimide resin is thermally stable and also is flexible. Thus, the resin is superior in strength, so that the service life of the cooling device 1 can be increased.

(Method of Producing Cooling Device)

Figure 6:
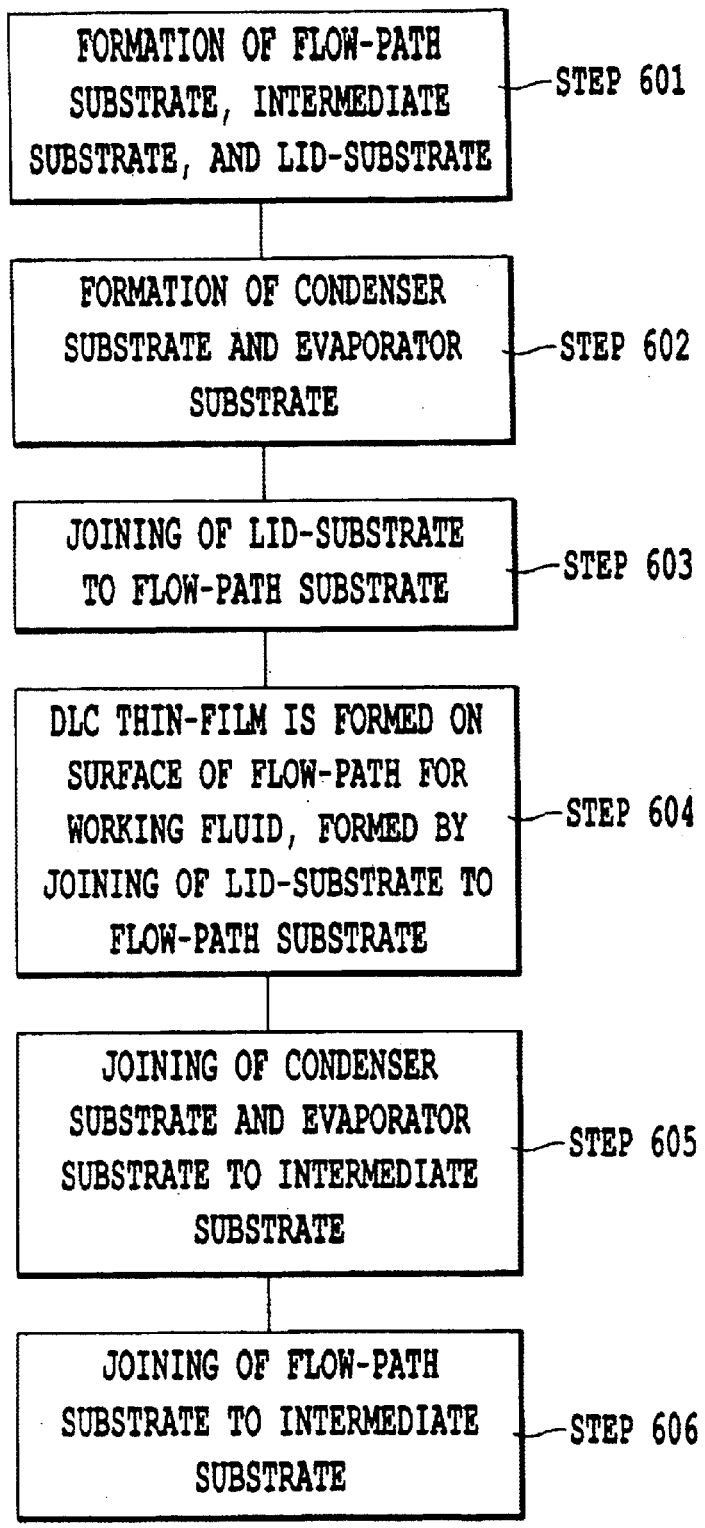
FIG. 6 illustrates a process of producing the cooling device of the present invention.

FIG. 6 illustrates processes of producing the cooling device.

First, the open grooves 11 are formed in the flow-path substrate 10, and the holes are formed in the intermediate substrate 30. The grooves and the holes function as a heat pipe (step 601). The open groove 11 is formed at the surface 10a of the flow-path substrate 10 made of a polyimide resin. The open groove 11 functions as the liquid phase path 12, the gas phase path 15, the reservoir 13, the evaporation portion 14, and the low temperature portion 16. The holes 31 and 32 are formed in the intermediate substrate 30, which is made of a polyimide resin, so as to pass through the intermediate substrate 30.

FIGS. 7A to 7E show a process of forming the flow-path substrate 10 as an example of the step 601.

Figure 7A:
FIGS. 7A, 7B, 7C, 7D, and 7E schematically show a process of forming a flow-path substrate for use in the cooling device of the present invention.

FIG. 7A shows the flow-path substrate 10 before the processing, having a thickness of about 25 to 1000 μm.

Figure 7B:
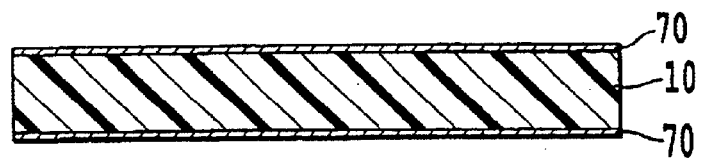

Then, as shown in FIG. 7B, copper thin films 70 are formed on both of the sides of the flow-path substrate 10 which are to be bonded to the intermediate substrate 30 and the lid-substrate 50, respectively. Regarding a method of forming the copper thin-films 70, both of the sides of the flow-path substrate 10 are processed with oxygen-plasma for surface-modification of the substrate. Then, the copper thin films 70 are formed thereon by vapor-deposition using sputtering so as to have a thickness of about 50 nm to 1 μm.

Figure 7C:
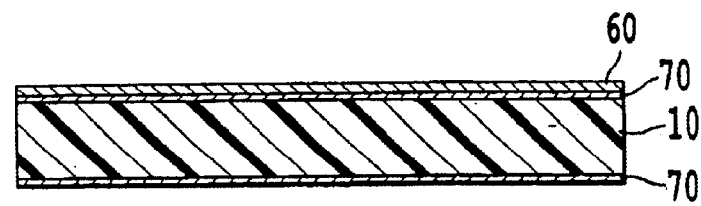

Next, the formed flow-path substrate 10 having the copper thin-film 70 as shown in FIG. 7C is placed into a vacuum hot press machine, and heat at a temperature of 150° C. to 350° C. is applied to the substrate under a reduced pressure of about $10^{-4}$ Torr to 10 Torr. An adhesion layer 60 is fixed to the bonding surface of the lid-substrate 50 at a pressure of 2 to 60 kg/cm$^2$ by hot-press bonding.

Figure 7D:
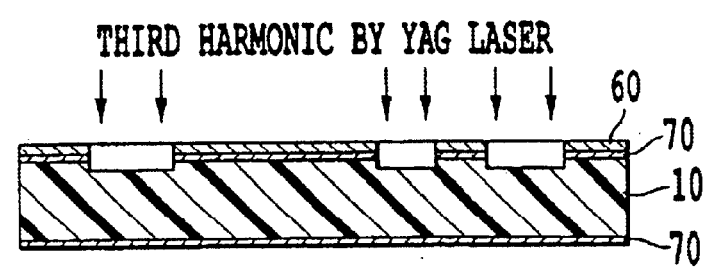

Next, as shown in FIG. 7D, the flow-path substrate 10 is set in a laser machine, and the third harmonic by YAG laser is irradiated thereto from one side of the flow-path substrate 10 to work the substrate 10. In this case, it is necessary to input a desired pattern for the flow-path substrate 10 into the laser machine in advance.

Figure 7E:
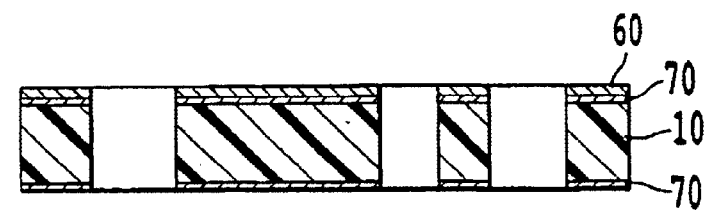

Then, as shown in FIG. 7E, the open groove 11 is formed in the flow-path substrate 10 so as to be passed trough the substrate 10 in the desired pattern by means of the third harmonic by the laser.

The method of forming the open groove 11 in the flow-path substrate 10 is described above. Regarding the intermediate substrate 30, the copper thin-film and the adhesion layer 60 are formed in the same manner as described above, and then, holes are formed by laser-machining in the same manner as described above. Moreover, regarding the lid-substrate 50, the copper thin-film 70 is formed on the bonding surface thereof for the flow-path substrate 10. For the lid-substrate 50, it is not required to form holes. Thus, laser machining is not carried out.

Next, grooves are formed on the condenser substrate 20 and the evaporator substrate 40 so that the function of the heat pipe can be realized (step 602).

Figure 8A:
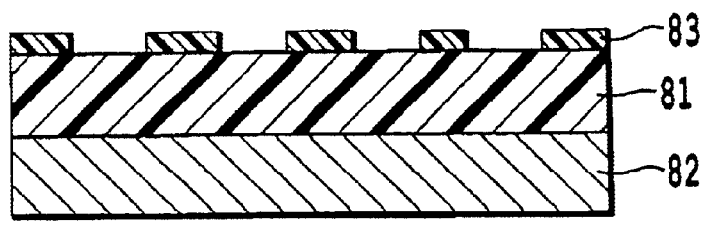
FIGS. 8A, 8B, 8C, and 8D schematically show a process of forming a condenser substrate and an evaporator substrate for use in the cooling device of the present invention.

First, as shown in FIG. 8A, a resist layer 81, e.g., made of SU 8, which is an organic material, is formed on a plate 82. A resist layer 83 is formed thereon in a pattern. The plate 82 and the layers 81 and 83 constitute a pattern substrate 80.

Figure 8B:
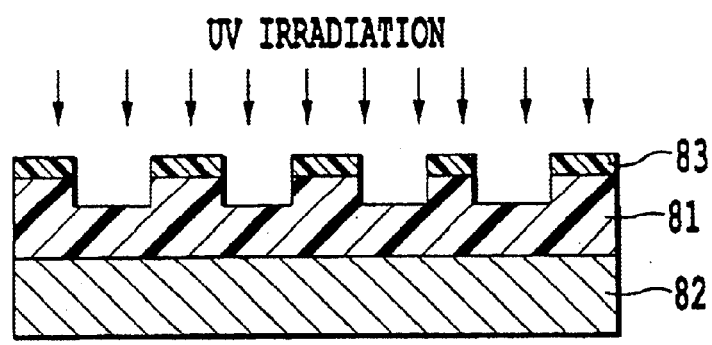

Thereafter, as shown in FIG. 8B, UV rays are irradiated from the upper side of the pattern layer 80 so that the resist layer 81 is etched.

Figure 8C:
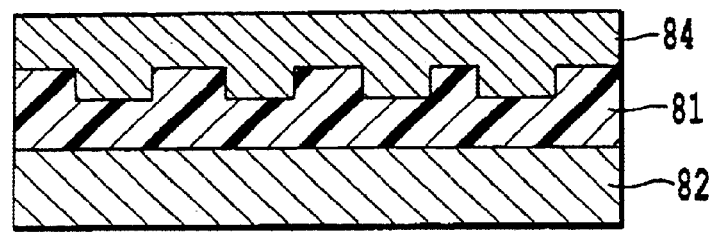

Next, as shown in FIG. 8C, the resist layer 83 is peeled off from the pattern substrate 80. A copper layer 84 is formed on the formed surface by electro-forming of copper.

Figure 8D:
Figure 9:
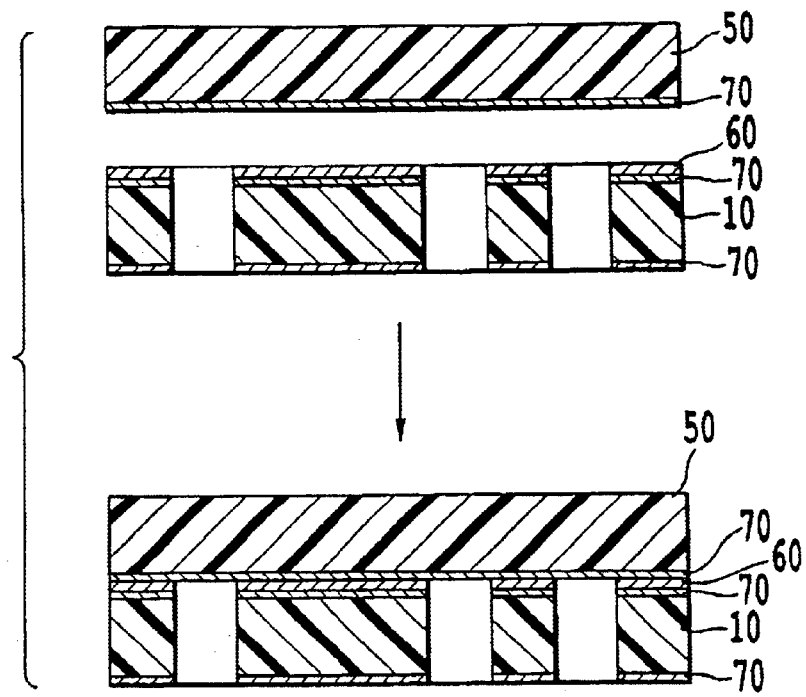
FIG. 9 schematically shows a process of joining the flow-path substrate and a lid-substrate to each other which are used in the cooling device of the present invention.

Then, the copper layer 84 is peeled off from the pattern substrate 80 as shown in FIG. 8D. The formed copper layer 84 constitutes each of the condenser substrate 20 and the evaporator substrate 40 each having grooves.

In the next process of the production of the cooling device, the flow-path substrate 10 and the lid-substrate 50 are joined to each other by hot press joining (step 603).

As described above, the flow-path substrate 10 and the lid-substrate 50 are joined to each other via the copper thin-films and the adhesion layer 60, which are formed on the bonding surfaces thereof, by applying a pressure of 2 to 60 kg/cm$^2$ under a reduced pressure of 10$^{-4}$ Torr to 10 Torr, at a temperature of 150 to 350° C., and for 5 to 15 minutes.

After the flow-path substrate 10 and the lid-substrate 50 are joined to each other, a thin film of DLC (not shown) is formed on the surface of the produced flow-path for a working fluid (step 604).

In particular, first, a copper thin film is embedded into the surface of the groove as the working fluid flow-path, which is formed in the step 603, and is introduced into a PBII apparatus. Oxygen ions are implanted into the surface of the groove to modify the copper surface. The portion not to be processed of the working fluid flow-path, i.e., the portion excluding the groove, is protected by a metal mask or a resist mask as a protecting film. The flow-path substrate 10 and the lid-substrate 50 are placed in the center of the vacuum apparatus and are connected to a pulse electric source via an insulator. The vacuum apparatus is evacuated by means of a vacuuming pump. Moreover, oxygen, methane, nitrogen, titanium, or the like is converted to the pulse plasma at an ion source to be supplied synchronously with the pulse. As described above, the portion not to be processed is protected by the protecting film. Accordingly, the DLC thin film can be formed in the region to be selectively processed, i.e., the groove of the working fluid flow-path only. Methane gas supplied from the ion source is converted to its pulse-plasma. Thus, the DLC thin film with a thickness of 3 $\mu$m is formed on the modified surface of the groove of the working fluid flow-path. The contact angle of water to the surface is 70 degrees. Moreover, CF$_4$ gas supplied from the ion source is converted to its pulse-plasma, and is ion-implanted for about 3 minutes, so that fluorine is substituted for the hydrogen at the surface. In this case, the contact angle of water to the surface becomes 110 degrees. Thus, the DLC thin film is formed on the groove for the working fluid flow-path. The oxidation of the copper is described above. In the case in which titanium is used instead of copper and is implanted, similar results are also obtained.

Figure 10:
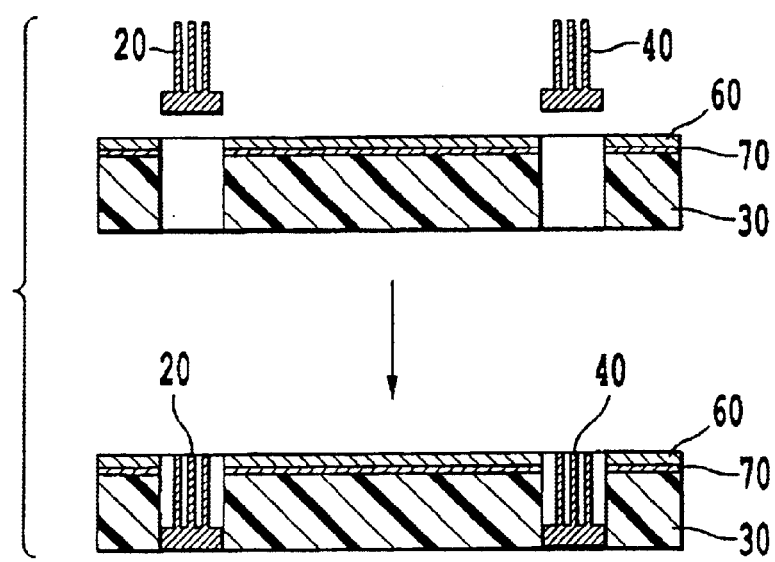
FIG. 10 schematically shows a process of incorporating the condenser substrate and the evaporator substrate into an intermediate substrate for use in the cooling device of the present invention.

As shown in FIG. 10, the condenser substrate 20 and the evaporator substrate 40 are joined to the holes 31 and 32 of the intermediate substrate 30, respectively (step 605).

In particular, the condenser substrate 20 and the evaporator substrate 40 are incorporated into the intermediate substrate 30 having the adhesion layer 60 made of a thermoplastic polyimide resin formed on the bonding surface, from the bonding surface side of the substrate 30, and are joined thereto by application of a pressure of 2 to 60 kg/cm$^2$ at a predetermined temperature of 150 to 350° C. for 5 to 150 minutes under the reduced pressure condition of 10$^{-4}$ to 10 Torr.

Figure 11:
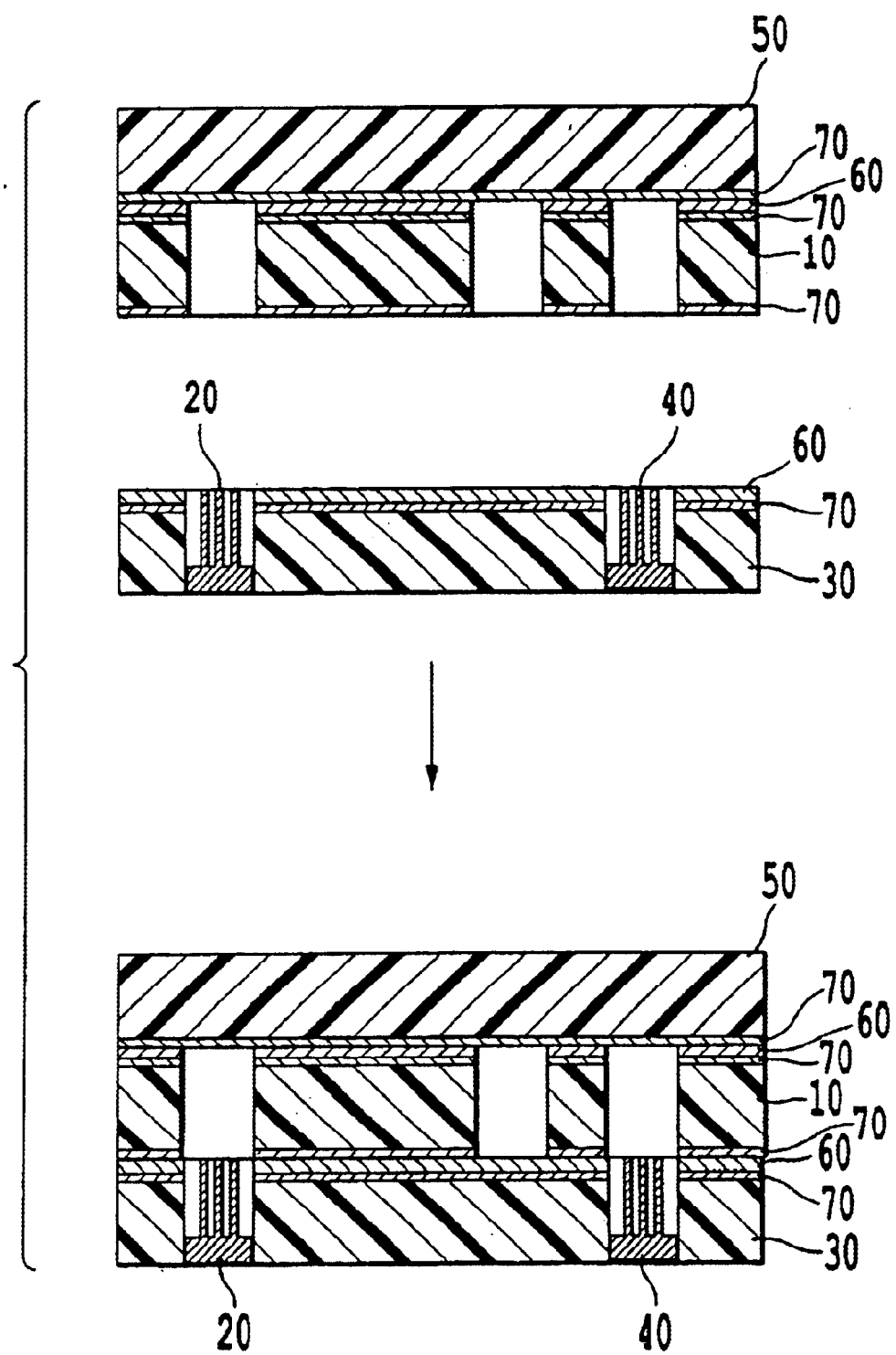
FIG. 11 schematically shows a process of joining the flow-path substrate and the intermediate substrate to each other, the flow-path substrate having the lid-substrate joined thereto, the intermediate substrate having the condenser substrate and the evaporator substrate joined thereto.

Finally, as shown in FIG. 11, the flow-path substrate 10 to which the lid-substrate 50 is joined is joined to the intermediate substrate 30 to which the condenser substrate 20 and the evaporator substrate 40 are joined as described above (step 606).

In particular, the intermediate substrate 30 having the copper thin film and the adhesion layer 60 made of a thermoplastic polyimide resin formed on the bonding surface thereof is joined to the flow-path substrate 10 by pressing at a pressure of 2 to 60 kg/cm$^2$ at a temperature of 150 to 350° C. for 5 to 15 minutes under the reduced pressure of 10$^{-4}$ to 10 Torr.

In this embodiment, as the material for the condenser substrate 20 and the evaporator substrate 40, copper is used. Other materials such as silicon, nickel, or the like may be used.

In this embodiment, for the adhesion layer 60, a thermoplastic polyimide resin is used. A thermosetting polyimide resin may be used. In the case, the thermosetting polyimide resin is cured by heating. Thus, suitably, the adhesion layer 60 is heated in the final stage of the joining.

Moreover, according to this embodiment, laser processing is employed for forming of the open groove 11 in the flow-path substrate 10 and the holes 31 and 32 in the intermediate substrate 30. These groove and holes may be formed by forming using a mold, i.e., by hot embossing or the like. In this case, the open groove 11, which is formed in the flow-path substrate 10 so as to be passed through the substrate 10 as described above, are not limited to the open groove, and may be formed as an ordinary groove. In the case in which the groove 11 is formed as an ordinary groove, the lid-substrate 50 and the adhesion layer 60 become unnecessary. Thus, the device can be reduced in thickness. Also, preferably, the DLC thin film is formed on the groove which constitutes the flow-path of the heat pipe.

Referring to the processing of the open groove 11 of the flow-path substrate 10 and the holes 31 and 32 of the intermediate substrate 30, etching (chemical etching using an alkali solution of hydrazine, KOH, or the like, or plasma-etching using oxygen plasma), sand-blasting, and so forth may be employed.

According to this embodiment, for formation of the condenser substrate 20 and the evaporator substrate 40, a UV-LIGA method is used. The formation may be carried out by photo-etching, machining, reactive ion etching (RIE) or the like.

The heat pipe can be efficiently produced according to the above-described production methods.

(Other Example of Cooling Device)

Figure 12:
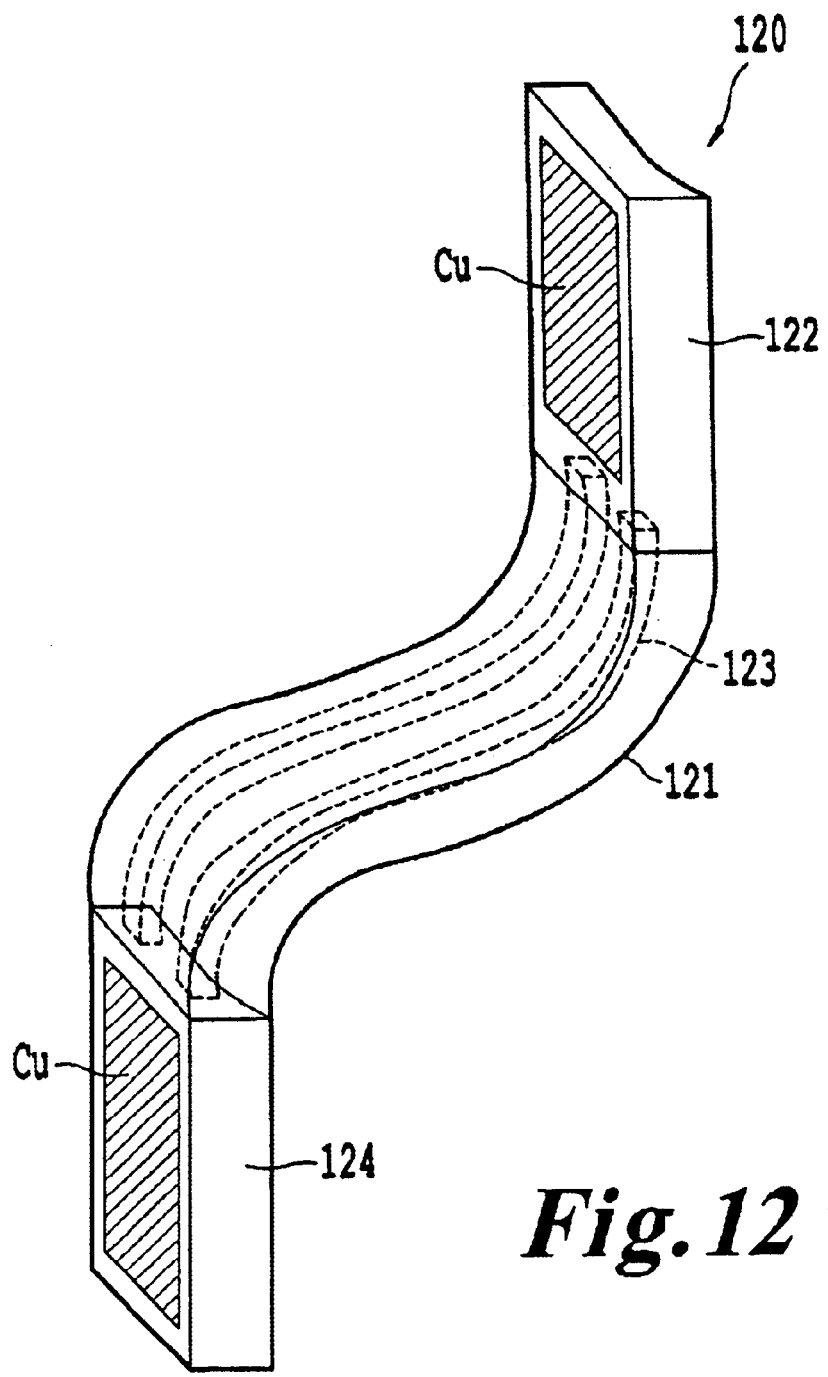
FIG. 12 schematically shows a cooling device according to another embodiment of the present invention.

FIG. 12 shows a flexible cooling device 120 in which a condenser member 122 and an evaporator member 124 are connected to each other via a flexible substrate 121.

The condenser member 122 and the evaporator member 124 are made of a polyimide resin, respectively. The condenser substrate 20 and the evaporator substrate 40 are incorporated therein by the above-described method.

The flexible substrate 121 is made of a plastic, and contains the flow-path 123 of a heat pipe. These members and the substrates are integrated to form the heat pipe.

The flexible substrate 121 can be desirably deformed. For example, the evaporator member 124 fixed, e.g., to a heating unit of an electronic apparatus, and the flexible substrate can be disposed so as to be extended in close contact with the surface features of the electronic apparatus.

According to the above-described structure of the cooling device, the heat pipe can be efficiently installed even in a narrow space. Thus, the size or thickness of the electronic apparatus or the like can be reduced.

(Electronic Apparatus)

Figure 13:
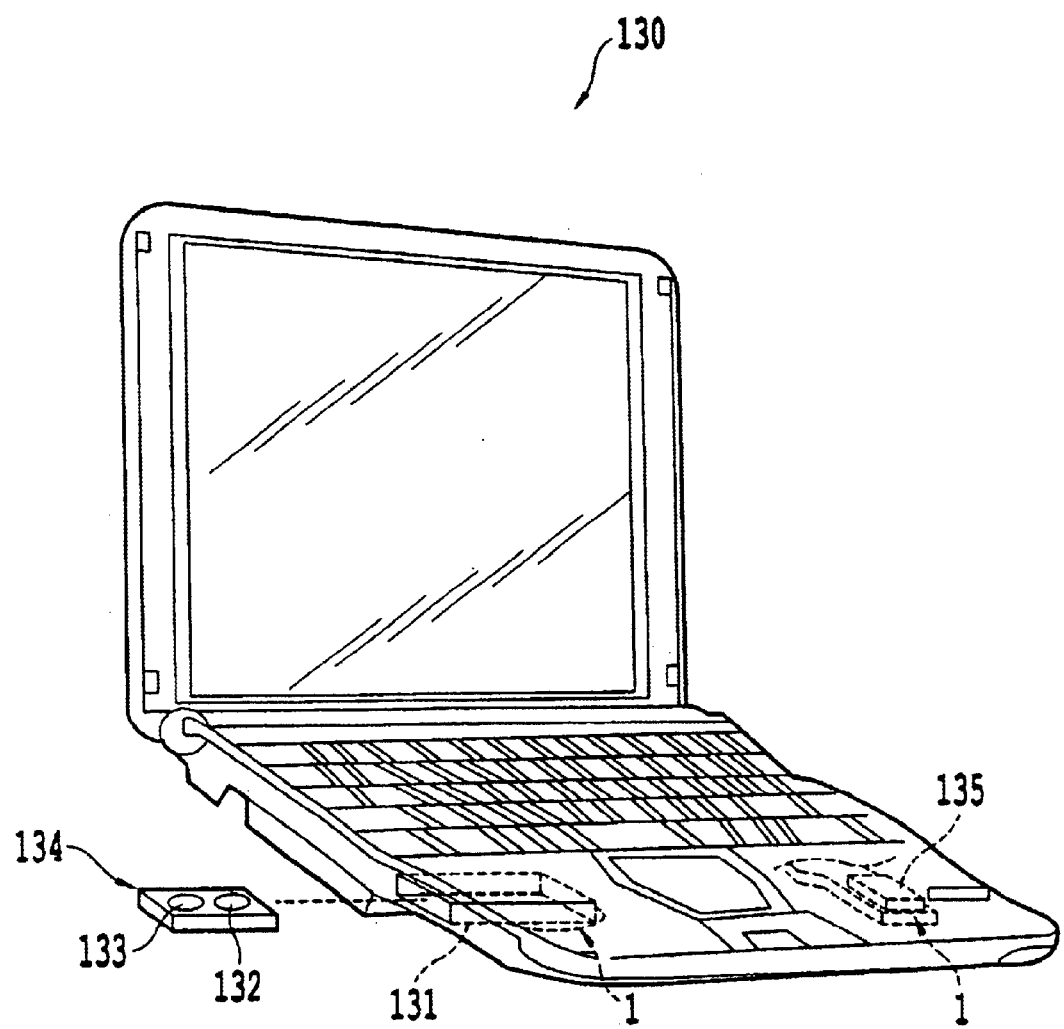
FIG. 13 is a schematic perspective view of a personal computer on which the cooling device of the present invention is mounted.

FIG. 13 is a schematic perspective view of a personal computer in which the cooling device of the present invention is mounted.

A personal computer 130 contains a slot 131 to or from which a storage medium 134 having a flash memory 133 and a driver 132 is attached or detached, and a central processing unit (CPU) 135. The cooling device 1 of the present invention is arranged in the personal computer 130 so that the wick is positioned, e.g., under the driver 132 of the storage medium 134 which is disposed in the slot 131.

Also, the cooling device 1 of the present invention may be arranged so that the evaporator is positioned adjacently to the central processing unit 135. In this case, the condenser is suitably positioned adjacently to a cooling fan or the like (not shown). Thereby, heat generated from the central processing unit 135 is absorbed by the evaporator. The heat is released from the condenser due to the action of the cooling fan. Thus, the central processing unit 135 can be cooled.

In the above-description, the personal computer is referred to as an example of the electronic apparatus. The cooling device of the present invention may be mounted onto other electronic apparatus such as a digital camera, a video camera, or the like.

(Display Unit)

Figure 14:
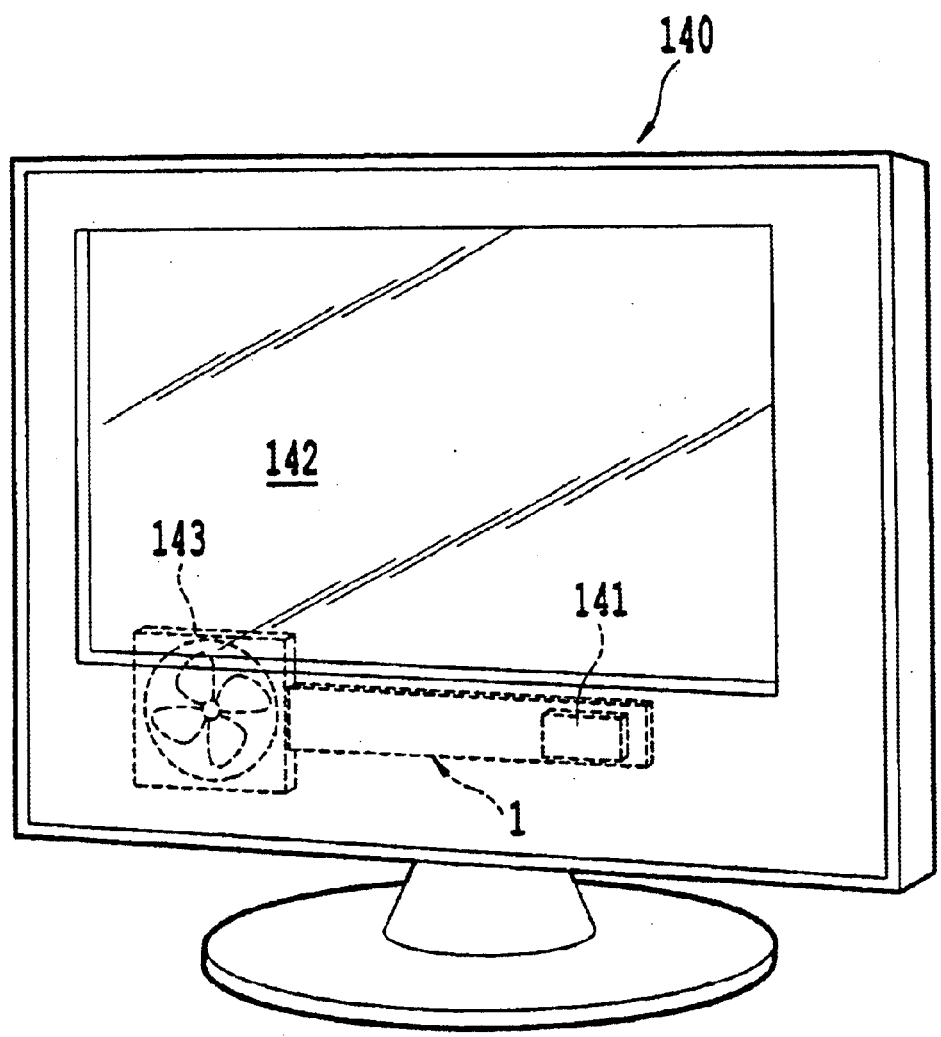
FIG. 14 is a schematic perspective view of a liquid crystal display unit on which the cooling device of the present invention is mounted.

FIG. 14 is a schematic perspective view of a liquid crystal display unit onto which the cooling device of the present invention is mounted.

A liquid crystal display unit 140 contains a driver 141, a display section 142, and a cooling fan 143. The cooling device 1 of the present invention is arranged in the liquid crystal display unit so that the evaporator is positioned adjacently to the driver 141, and the condenser is positioned adjacently to the cooling fan 143. The heat generated from the driver 142, caused by the operation of the liquid crystal display unit 140, is absorbed by the evaporator. The absorption heat causes the liquid in the cooling device 1 to be evaporated and flows into the condenser via the flow-path. The cooling fan 143 cools the condenser so that the heat of the gas flown into the condenser is released, and the gas is liquefied again. The liquid, produced in the condenser, is flown into the evaporator via the flow-path, and absorbs the heat generated from the driver 141 to be evaporated again. The driver 141 can be cooled by the above-described circulation of the liquid in the cooling device 1. Similarly, the display section 142 can be cooled by disposing the evaporator adjacently to the display section 142.

What is claimed is:

1. A cooling device comprising:

a first member having at least a wick as a component of a heat pipe;

a second member physically separated from the first member and provided with a condenser as a component of the heat pipe, the first member and the second member having grooves made of at least one of a metal and a material having a thermal conductivity substantially equal to that of a metal; and a flexible substrate interposed between the first member and the second member and having a flow-path formed therein so as to connect the wick and the condenser to each other, the flow-path formed in the flexible substrate has a diamond-like carbon film formed therein, wherein at least one of the first member and the second member being made of a polyimide resin.

* * * * *

UNITED STATES PATENT AND TRADEMARK OFFICE
CERTIFICATE OF CORRECTION

PATENT NO.    : 6,954,359 B2                                              Page 1 of 1
DATED         : October 11, 2005
INVENTOR(S)   : Motosuke Ohmi et al.

It is certified that error appears in the above-identified patent and that said Letters Patent is hereby corrected as shown below:

Column 2,
Line 7, change "diff-used" to -- diffused --.

Column 3,
Line 38, add -- be -- after "to".

Column 8,
Line 26, change "diff-used" to -- diffused --.

Signed and Sealed this

Twenty-fourth Day of January, 2006

JON W. DUDAS
*Director of the United States Patent and Trademark Office*